United States Patent
Sakaguchi et al.

(10) Patent No.: US 7,371,281 B2
(45) Date of Patent: May 13, 2008

(54) SILICON CARBIDE SINGLE CRYSTAL AND METHOD AND APPARATUS FOR PRODUCING THE SAME

(75) Inventors: Yasuyuki Sakaguchi, Chiba (JP); Atsushi Takagi, Chiba (JP); Naoki Oyanagi, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/528,556

(22) PCT Filed: Sep. 18, 2003

(86) PCT No.: PCT/JP03/11902

§ 371 (c)(1),
(2), (4) Date: Oct. 5, 2005

(87) PCT Pub. No.: WO2004/027122

PCT Pub. Date: Apr. 1, 2004

(65) Prior Publication Data

US 2006/0144324 A1    Jul. 6, 2006

Related U.S. Application Data

(60) Provisional application No. 60/414,659, filed on Oct. 1, 2002.

(30) Foreign Application Priority Data

Sep. 19, 2002  (JP) ............................. 2002-272384

(51) Int. Cl.
*C30B 23/00* (2006.01)
*C30B 25/00* (2006.01)
*C30B 28/12* (2006.01)
*C30B 28/14* (2006.01)

(52) U.S. Cl. ............................. 117/89; 117/84; 117/88; 117/91; 117/100; 117/105; 117/935

(58) Field of Classification Search ................. 117/84, 117/88, 951, 99, 91, 935, 108, 89, 93, 101, 117/105; 437/100; 118/612
See application file for complete search history.

(56) References Cited

U.S. PATENT DOCUMENTS 3,275,415 A * 9/1966 Chang et al. .................. 117/87

(Continued)

FOREIGN PATENT DOCUMENTS

| JP | 51-8400 B | 3/1976 |
| JP | 6-316499 A | 11/1994 |

OTHER PUBLICATIONS

Heydemann V D, et al., "Growth of 6H and 4H Silicon Carbide Single Crystals by the Modified Lely Process Utilizing a Dual-Seed Crystal Method", Applied Physics Letters, American Institute of Physics, New York, US, vol. 69, No. 24, Dec. 9, 1996, pp. 3728-3730, XP000644119.

(Continued)

*Primary Examiner*—Yogendra N. Gupta
*Assistant Examiner*—Seyed Masoud Malekzadeh
(74) *Attorney, Agent, or Firm*—Sughrue Mion, PLLC

(57) ABSTRACT

A growth crucible (2) for depositing on a seed crystal substrate (5) a silicon carbide single crystal (6) using a sublimate gas of a silicon carbide raw material (11) is disposed inside of an outer crucible (1). During the course of silicon carbide single crystal, a silicon raw material (22) is continuously fed from outside into a space between the growth crucible and the outer crucible for the purpose of vaporizing the silicon raw material. An atmosphere gas surrounding the growth crucible is constituted of a silicon gas. The pressure of the atmosphere silicon gas is controlled to suppress a variation in the composition of the sublimate gas within the growth crucible to thereby grow a large-sized silicon carbide single crystal with few crystal defects on the seed crystal substrate reliably at a high growth rate.

7 Claims, 2 Drawing Sheets

U.S. PATENT DOCUMENTS

| | | | | |
|---|---|---|---|---|
| 4,866,005 | A | * | 9/1989 | Davis et al. .................. 117/98 |
| 5,211,801 | A | | 5/1993 | Stein |
| 6,193,797 | B1 | * | 2/2001 | Shiomi et al. ................ 117/88 |
| 6,406,539 | B1 | * | 6/2002 | Shigeto et al. ................ 117/88 |
| 6,428,621 | B1 | * | 8/2002 | Vodakov et al. ............ 117/108 |
| 2001/0004877 | A1 | * | 6/2001 | Shigeto et al. ................ 117/84 |

OTHER PUBLICATIONS

Rost H-J, et al., "Influence of different growth parameters and related conditions on 6H-SiC crystals grown by the modified Lely method", Materials Science and Engineering B, Elsevier Sequoia, Lausanne, CH, vol. 61-62, Jul. 30, 1999, pp. 68-72, XP004363305.

Patent Abstracts of Japan, vol. 2000, No. 12, Jan. 3, 2001 & JP 2000-264793 A, (Denso Corp), Sep. 26, 2000.

Patent Abstracts of Japan, vol. 2000, No. 23, Feb. 10, 2001 & JP 2001-158695 A, (Denso Corp, Toyota Central Res & Dev Lab Inc), Jun. 12, 2001.

Takashi, et al., "Sublimation growth of SiC single crystalline ingots on faces perpendicular to the (0001) basal plane," *J. Crystal Growth* *135*:61-70 (1994).

\* cited by examiner

SILICON CARBIDE SINGLE CRYSTAL AND METHOD AND APPARATUS FOR PRODUCING THE SAME

CROSS REFERENCE TO RELATED APPLICATIONS

This application is an application filed under 35 U.S.C. §111(a) claiming the benefit pursuant to 35 U.S.C. §119(e)(1) of the filing date of Provisional Application Ser. No. 60/414,659 filed Oct. 1, 2002 pursuant to 35 U.S.C. §111(b).

TECHNICAL FIELD

The present invention relates to a silicon carbide (SiC) single crystal and to a method and apparatus for producing the silicon carbide single crystal. More particularly, the present invention relates to a method for producing a large-sized silicon carbide single crystal of high quality containing few crystal defects, e.g., micropipes.

BACKGROUND ART

Silicon carbide single crystal, which has become of interest as a semiconductor material, is generally produced through a sublimation process employing silicon carbide powder serving as a raw material. In the sublimation process, the silicon carbide powder and a seed crystal substrate are placed in the interior of a graphite-made growth crucible such that the powder and the substrate face each other, and the silicon carbide raw material is heated to 1,800 to 2,400° C. in an inert gas atmosphere. The thus generated silicon carbide sublimate gas reaches the seed crystal substrate, which is maintained at a temperature suitable for crystal growth, whereby a silicon carbide single crystal is deposited on the substrate.

In the sublimation process, sublimate gas components, e.g., Si, $Si_2C$, $SiC_2$ and SiC, are generated from the silicon carbide raw material, and some of the gas components are deposited onto the seed crystal substrate to thereby grow a silicon carbide single crystal. In the sublimation process, the silicon carbide single crystal is grown through sublimation and deposition of a solid compound. Therefore, the sublimation process involves the problems in 1) that the growth rate of the single crystal is low and 2) that when the growth rate is increased, generation of crystal defects and polycrystallization tend to occur.

During the growth process of the silicon carbide single crystal, the composition of the sublimate gas varies depending on various factors including sublimation and decomposition of the silicon carbide powder serving as a raw material, interaction between the sublimate gas components in a vapor phase and reaction of the gas components with graphite constituting the inner wall of the growth crucible. When the silicon carbide raw material is heated, the silicon component, which has a high vapor pressure, is readily gasified, but the carbon component tends to remain in the raw material. Therefore, during the heating process, sublimation of the silicon component contained in the silicon carbide raw material precedes sublimation of the carbon component. This phenomenon is one of the factors that cause variation in the composition of the sublimate gas. Other factors causing variation in the composition of the sublimate gas include the sublimation temperature of the raw material, the composition of the raw material and time-course change in the temperature profile in the growth crucible.

Variation in the composition of the sublimate gas at a region in the vicinity of the surface of the seed crystal substrate on which the single crystal is grown is considered to cause generation of crystal defects in silicon carbide crystals and formation of polytypes or growth of anisotropic crystals (i.e., polycrystallization), which lead to deterioration of crystallinity of the single crystal. Therefore, production of a silicon carbide single crystal of high quality requires control of the aforementioned factors that cause variation in the composition of the sublimate gas.

Conventionally, several measures have been taken in order to improve crystallinity of a silicon carbide single crystal. For example, when a silicon carbide single crystal is grown, the growth rate thereof is lowered to thereby suppress generation of crystal defects, or the time for growth continuity of the single crystal is shortened so as to reduce variation in the composition of a sublimate gas. However, these measures are not satisfactory in terms of the quality and stability of a silicon carbide single crystal produced through the sublimation process.

In view of the foregoing, the following improvement in the sublimation process has been proposed in JP-A HEI 6-316499, for example. The improvement relates to a method for reducing variation in the composition of a sublimate gas, which method comprises disposing a silicon raw material and a carbon raw material separately, reacting gas components generated from the silicon raw material with the carbon raw material to thereby form silicon carbide, and sublimating the thus formed silicon carbide to produce a silicon carbide single crystal. However, this method inevitably involves a fundamental problem associated with the sublimation process, i.e., variation in the composition of the sublimate gas with the progress of sublimation of the silicon carbide. In addition, in this method, production of a silicon carbide single crystal requires a two-step process, leading to relatively long production time.

In addition, JP-B SHO 51-8400 discloses a method that comprises evaporating silicon under heating in a reaction crucible, reacting the resultant silicon vapor with carbon vapor obtained through evaporation of carbon contained in the inner wall of the crucible, and transferring the resultant reaction gas into a silicon carbide deposition chamber to thereby deposit a silicon carbide single crystal onto the inner wall of the chamber. However, this method entails a drawback in that the growth rate of the silicon carbide single crystal is low since the vapor pressure of carbon is lower than that of silicon.

As described above, there has not yet been established an effective method for controlling factors causing variation in the composition of a sublimate gas to thereby grow a silicon carbide single crystal of high crystallinity.

In view of the foregoing, an object of the present invention is to provide a method for growing, through the sublimation process, a large-sized silicon carbide single crystal with few crystal defects on a seed crystal substrate at a high growth rate and in a reliable manner, with an atmosphere gas controlled to reduce variation in the composition of a sublimate gas and provide an apparatus for carrying out the method.

Another object of the invention is to provide a silicon carbide single crystal, with crystal defects reduced and with quality and stability maintained sufficiently high.

DISCLOSURE OF THE INVENTION

The present invention provides a method for producing a silicon carbide single crystal, which comprises providing a graphite-made growth crucible with a low-temperature section and a high-temperature section, placing a seed crystal substrate formed of silicon carbide (SiC) single crystal in the low-temperature section of the growth crucible, placing a silicon carbide raw material in the high-temperature section and depositing a gas sublimated from the silicon carbide raw material onto the seed crystal substrate to thereby grow a silicon carbide single crystal, wherein an atmosphere gas surrounding the growth crucible contains a silicon (Si) gas.

In the method for producing a silicon carbide single crystal, the silicon carbide single crystal is grown, with vapor pressure of silicon gas in the growth crucible (crucible interior silicon gas pressure) maintained substantially equal to or higher than equilibrium vapor pressure of silicon gas in the gas sublimated from the silicon carbide raw material (sublimate gas interior silicon gas pressure).

The method for producing a silicon carbide single crystal further comprises using an outer crucible to surround the growth crucible with a space left therebetween, continuously feeding a silicon raw material from outside into the space and evaporating the silicon raw material in the space to thereby form a silicon gas serving as the atmosphere gas surrounding the growth crucible.

In the method for producing a silicon carbide single crystal, the silicon raw material is fed from the outside in solid form, preferably in a form of powder constituted by particles having a diameter of 0.2 to 5 mm, at a rate of 0.5 to 20 mg/second.

In the method for producing a silicon carbide single crystal, a position within the space to which the silicon raw material is fed has a temperature regulated to at least 1,900° C.

In the method for producing a silicon carbide single crystal, the atmosphere gas surrounding the growth crucible has a pressure regulated to $1.33 \times 10^2$ to $4.0 \times 10^4$ Pa, preferably to $6.65 \times 10^3$ to $2.0 \times 1$ Pa, a growth rate of the silicon carbide single crystal is 1 mm/hour or more, and a micropipe density is 10,000 micropipes/cm$^2$ or less.

The present invention also provides an apparatus for producing a silicon carbide single crystal, comprising a graphite-made growth crucible having a low-temperature section and a high-temperature section, a seed crystal substrate formed of silicon carbide single crystal and placed in the low-temperature section, a silicon carbide raw material placed in the high-temperature section, whereby a gas sublimated from the silicon carbide raw material is deposited onto the seed crystal substrate to thereby grow a silicon carbide single crystal, and further comprising an outer crucible disposed to surround the growth crucible, with a space left therebetween and means for continuously feeding a silicon raw material from outside into the space.

In the apparatus for producing a silicon carbide single crystal, the feeding means is a metered feeding apparatus for feeding a solid silicon raw material at a rate of 0.5 to 20 mg/second.

In the apparatus for producing a silicon carbide single crystal, the growth crucible has a lid and is provided therein with a supporter having a lower surface to which the seed crystal substrate is to be attached, with a space left between an upper surface of the supporter and the lid of the growth crucible.

As described above, in the present invention, by surrounding by an atmosphere gas of silicon carbide a growth crucible provided therein with a seed crystal substrate on which a silicon carbide single crystal is deposited using a sublimate gas of a silicon carbide raw material and maintaining the atmosphere gas pressure higher than the pressure of the silicon gas in the sublimate gas within the growth crucible, the silicon gas diffuses within the growth crucible through the growth crucible wall, thereby enabling the generation of crystal defects to be suppressed to a great extent and a large-sized single crystal to be grown reliably on the seed crystal substrate.

Particularly by regulating the pressure of the atmosphere gas surrounding the growth crucible to $1.33 \times 10^2$ to $4.0 \times 10^4$ Pa, a high growth rate of the silicon carbide single crystal that is 1 mm/hour or more can be attained.

BEST MODE FOR CARRYING OUT THE INVENTION

Figure 1:
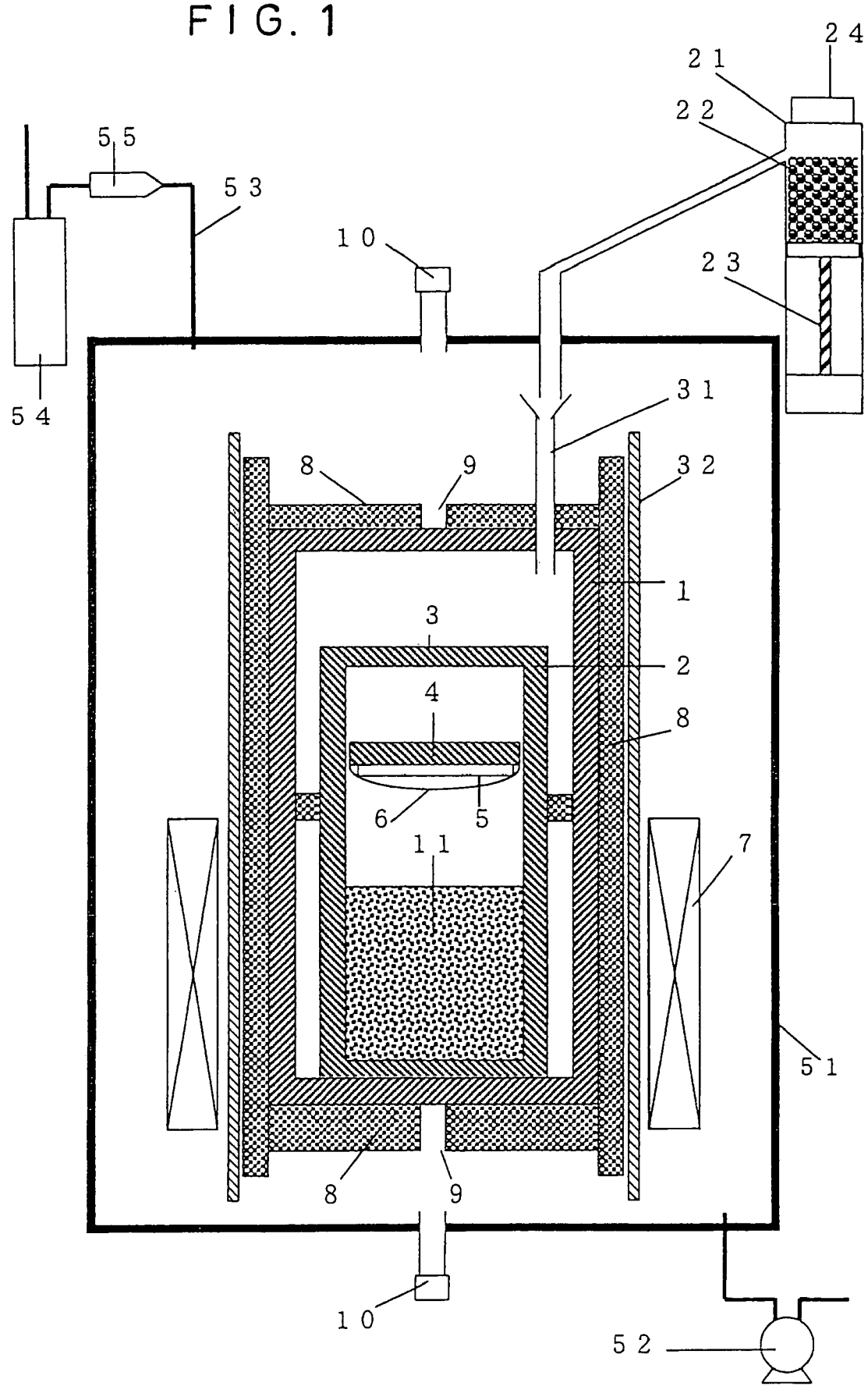
FIG. 1 is a cross section showing an example of the apparatus for producing a silicon carbide single crystal of the present invention.

FIG. 1 shows an example of the apparatus for producing a silicon carbide single crystal of the present invention. An embodiment of the present invention will now be described with reference to FIG. 1. In FIG. 1, reference numerals 1 and 2 denote an outer crucible and a growth crucible, respectively. The growth crucible 2 is provided within the outer crucible 1. The growth crucible 2 has a lid 3 and is provided therein with a supporter 4, with a predetermined space left therebetween (support means for the supporter 4 omitted from FIG. 1). The lid 3 may serve also as the supporter 4. The growth crucible 2 is formed of graphite. The outer crucible 1, lid 3 and supporter 4 are preferably formed of graphite. When the graphite is required to have a high purity, the graphite is preferably subjected to purification treatment employing a halogen gas. The lower section of the growth crucible 2 has a capacity such that a sufficient amount of a silicon carbide raw material 11 can be reserved therein during the course of crystal growth.

In the present invention, crystal growth of silicon carbide is performed by use of the silicon carbide single crystal production apparatus shown in FIG. 1 and through the following procedure. Firstly, a seed crystal substrate 5 formed of silicon carbide single crystal is attached to the lower surface of the supporter 4 by means of, for example, mechanical connection or a bonding agent. The seed crystal substrate 5 may be a seed crystal substrate formed into a plate from silicon carbide single crystal produced through the Acheson method, Lely method, sublimation process or method of the present invention. The surface orientation of the seed crystal substrate is generally a (0001) plane. However, the surface orientation of the seed crystal substrate may be deviated from the (0001) plane. A sufficient amount of the powdery silicon carbide raw material 11 is placed in the lower section of the growth crucible 2. In order to produce a silicon carbide single crystal of high specific resistance suitable for use as a semiconductor, preferably, the silicon carbide raw material 11 has a high purity of 99.999999% (hereinafter may be referred to as "8 nines").

The preferable distance between the seed crystal substrate 5 and the silicon carbide raw material 11 is in the range of 20 to 100 mm. When it is less than 20 mm, it is difficult to make a difference in temperature between the two. When it is more than 100 mm, the sublimate gas of the silicon carbide raw material is difficult to reach the seed crystal substrate.

A high-frequency induction coil 7, serving as a heating apparatus for heating the outer crucible 1 and growth crucible 2, is provided outside the outer crucible 1. This heating apparatus is employed for heating the silicon carbide raw material 11 in the growth crucible 2 to a temperature at which a sublimate gas is generated, e.g., 1,900° C. or higher. The heating apparatus may be of a resistance heating type. In order to maintain the temperature of the outer crucible 1 at a high level, the outer crucible 1 is covered with heat insulators 8 formed of, for example, carbon fiber. In order to attain a desired temperature profile in the growth crucible 2, i.e., in order to provide a high-temperature section in the portion at which the silicon carbide raw material 11 is placed and a low-temperature section in the portion at which the seed crystal substrate 5 is placed, the seed crystal substrate is set in position at a predetermined distance from the silicon carbide raw material. In order to materialize a desired temperature profile of the growth crucible 2, the high-frequency induction coil 7 employed for heating the crucible 2 may be divided into upper and lower portions, with the currents applied to the respective portions of the high-frequency induction coil being controlled independently. Alternatively, the winding pitch of the high-frequency induction coil 7 may be varied along the vertical direction. In order to measure the temperature of the outer crucible 1, temperature measurement holes 9 are provided in the heat insulators 8 covering the bottom and top of the outer crucible 1. The temperature of the surface of the outer crucible 1 can be measured by use of radiation thermometers 10 via the temperature measurement holes 9. On the basis of the temperature measurement results, the position of the high-frequency induction coil 7 or the current applied to the coil 7 can be regulated to thereby attain a desired temperature profile in the growth crucible 2.

As described above, by bringing the temperature profile in the growth crucible to a predetermined state, the silicon carbide raw material is heated to deposit the sublimate gas generated on the surface of the seed crystal substrate 5 directed downward, thereby growing a silicon carbide single crystal 6 thereon.

During the course of silicon carbide single crystal growth, the temperature of the high-temperature section in which the silicon carbide raw material 11 is provided is regulated to 1,900° C. or higher, preferably 2,300° C. or higher, and the temperature of the low-temperature section in which the seed crystal substrate 5 is provided is regulated to 1,500 to 2,500° C., preferably 2,000 to 2,400° C. In order to reliably grow a silicon carbide single crystal on the seed crystal substrate, generally, the temperature of the silicon carbide raw material must be regulated to be higher by at least 100° C. than that of the seed crystal substrate.

During the course of silicon carbide single crystal growth, when the silicon carbide raw material in the growth crucible is heated to 1,900° C. or higher, preferably 2,300° C. or higher, the vapor pressure of a sublimate gas generated from the raw material becomes sufficiently high, and the growth rate of the silicon carbide single crystal can be increased. When the temperature of the seed crystal substrate is lower than 1,500° C., in some cases, polytypes tend to form in the grown crystal or growth of the single crystal fails to proceed. In contrast, when the temperature of the seed crystal substrate is higher than 2,500° C., generation of various crystal defects and formation of polytypes tend to occur.

A characteristic feature of the present invention resides in that, during the course of silicon carbide single crystal growth, a silicon (Si) gas serves as an atmosphere gas surrounding the growth crucible 2. When the growth crucible 2 is provided within the outer crucible 1 and when a silicon raw material is continuously fed from the outside of the outer crucible 1 into a space provided between the growth crucible 2 and the outer crucible 1, to thereby continuously evaporate the silicon raw material, during the course of silicon carbide single crystal growth, the resultant silicon gas serves as the atmosphere gas surrounding the growth crucible 2.

In FIG. 1, reference numeral 21 denotes a raw material container from which a silicon raw material 22 is continuously fed, numeral 23 an extrusion-type feeding apparatus for feeding a predetermined amount of the raw material (hereinafter may be referred to simply as a "metered feeding apparatus"), and numeral 24 a vibration apparatus. Feeding of the silicon raw material from the outside of the outer crucible is carried out through the following procedure.

The silicon raw material 22 is placed in the raw material container 21. The silicon raw material 22 assumes a form such that the below-described metered feeding apparatus can be employed. No particular limitations are imposed on the material of the raw material container 21, so long as the material can be formed into a predetermined shape and as the silicon raw material 22 is not contaminated with impurities. For example, the container 21 may be formed of a metal, such as stainless steel. As shown in FIG. 1, the extrusion-type metered feeding apparatus 23 is mounted in the raw material container 21. The metered feeding apparatus is provided for feeding a predetermined amount of the silicon raw material 22 into the space provided between the growth crucible 2 and the outer crucible 1 at a predetermined period of time.

In the present invention, preferably, the amount of the silicon raw material 22 fed from the outside of the outer crucible is regulated such that the vapor pressure of the silicon gas surrounding the growth crucible provided within the outer crucible 1 (crucible-surrounding silicon gas pressure) becomes higher than that of the silicon gas contained in the sublimate gas in the growth crucible 2. That is, the interior of the crucible 1 is continuously filled with an excess amount of the silicon gas. The vapor pressure of the silicon gas contained in the sublimate gas in the growth crucible 2, used herein, is the equilibrium vapor pressure of silicon in the carbon-silicon carbide binary system. For example, when the temperature of the silicon carbide raw material in the growth crucible is 2,100° C., the equilibrium vapor pressure is about 61 Pa or more. Therefore, the silicon raw material is continuously fed into the crucible 1 so as to maintain crucible-surrounding silicon gas pressure higher than the equilibrium vapor pressure.

Since the growth crucible 2 formed of graphite exhibits no hermeticity against gas at a high temperature in the neighborhood of 2,000° C., the silicon gas surrounding the growth crucible permeates the growth crucible wall of graphite and diffuses inside the growth crucible. By making the crucible-surrounding silicon gas pressure excess as described above, the crucible interior silicon gas pressure can continuously be maintained in an excess state compared with the sublimate gas interior silicon gas pressure.

Though the pressure of the silicon gas obtained through evaporation of the silicon raw material in the outer crucible becomes equal to the pressure of the atmosphere gas in a growth chamber 51, since the silicon gas is gradually discharged through the growth chamber 51 to the outside of the single crystal growth apparatus, the silicon raw material is fed into the outer crucible 1 at a rate higher than the rate at which the silicon gas is discharged. As a result, the space between the outer crucible 1 and the growth crucible 2 can be filled with an excess amount of the silicon gas. In reality, the rate at which the silicon gas is discharged to the outside of the single crystal growth apparatus varies in accordance with, for example, the pressure maintained in the interior of the growth chamber 51, the diffusion rate of the silicon gas and the shape of the crucible. Therefore, in accordance with the growth apparatus to be employed, the feed rate of silicon must be appropriately determined on an experimental basis. The rate at which the silicon raw material is fed into the outer crucible is preferably 0.5 to 20 mg/second.

No particular limitations are imposed on the structure of the metered feeding apparatus, so long as the apparatus can feed the silicon raw material at the aforementioned feed rate. The feeding apparatus may be any of a screw feeder, an apparatus for extruding a predetermined amount of the raw material, and a vibration feeding apparatus. As shown in FIG. 1, when the vibration apparatus 24 for vibrating the raw material container is mounted on the metered feeding apparatus, feeding of the silicon raw material can be smoothly carried out, which is preferable. Preferably, the silicon raw material is fed in the form of solid, since the mechanism of the metered feeding apparatus can be simplified. Although the silicon raw material may be melted and fed in a predetermined amount, several measures are required for the method for maintaining the melted raw material, heating a path through which the raw material is fed or feeding a predetermined amount of the raw material.

The solid silicon raw material employed in the present invention preferably assumes the form of powder suitable for metered feeding. For example, the silicon raw material may be ground one or spherical polysilicon. The powdery silicon raw material preferably has an average particle size of 0.2 mm or more. When the average particle size is less than 0.2 mm, the powder stirs up during the course of feeding thereof or tends to adhere to the inner wall of a feed conduit 31, possibly leading to unreliable feeding. The upper limit of the particle diameter of the silicon raw material is almost determined from the viewpoints of impact of the fed silicon raw material onto the growth crucible and evaporation efficiency of the raw material. For example, a powdery raw material having a diameter of more than 5 mm cannot be employed. Preferably, the solid silicon raw material assumes the form of powder constituted by particles having a diameter of 0.2 to 5 mm. Particularly when the metered feeding apparatus is of an extrusion type, from the viewpoint of facilitation of feeding, the raw material preferably assumes a spherical form and has an average particle size of 1 to 2 mm.

In order to feed the silicon raw material 22 from the raw material container 21 into the outer crucible 1, the container and the crucible are connected via the feed conduit 31 formed of graphite. Depending on the temperature conditions, a conduit formed of quartz glass or silicon carbide may be employed. A conduit formed of a metal, such as stainless steel, may be employed at a portion of sufficiently low temperature. The conduit may be formed of a composite material of the aforementioned materials. When there is discharge from the high-frequency induction coil, the conduit is protected from the discharge using an insulating material 32 (e.g., ceramic or quartz glass).

The outer crucible 1 housing the growth crucible 2 therein, high-frequency induction coil 7 and conduit 31 are provided in the interior of the growth chamber 51 whose atmosphere can be controlled. The gas outlet of the growth chamber 51 is connected to a gas discharging apparatus 52, and the gas inlet of the chamber 51 is connected to a gas feed line 53 for feeding gas that has passed through a gas purification apparatus 54. A mass flow controller 55 is provided midway the gas feed line 53. During the course of silicon carbide single crystal growth, an inert gas, such as argon (Ar), serving as an atmosphere gas in the growth chamber 51, is fed through the gas feed line 53 into the growth chamber 51, and is discharged via the gas discharging apparatus 52. When the mass flow controller 55 and gas discharging apparatus 52 are regulated, the amount of the gas fed into the growth chamber 51 and the amount of the gas discharged from the growth chamber 51 can be controlled to thereby regulate the pressure in the growth chamber 51 to a predetermined value.

As shown in FIG. 1, the silicon raw material fed into the outer crucible 1 is evaporated, and the space between the outer crucible 1 and the growth crucible 2 is filled with the resultant silicon gas. No particular limitations are imposed on the position to which the silicon raw material is fed, so long as the position is in the space between the growth crucible and the outer crucible, since, when the temperature of the position is 1,900° C. or higher, the silicon raw material can be smoothly evaporated. At 1,900° C. or higher at which silicon carbide is grown through the typical sublimation process, the equilibrium vapor pressure of silicon is $2.7 \times 10^4$ Pa or more. Part of the silicon gas that is excessively generated in the space between the outer crucible 1 and the growth crucible 2 is discharged through the conduit 31 into the growth chamber 51. Since the graphite-made growth crucible exhibits no hermeticity against gas at a high temperature of about 2,000° C., the silicon gas remaining in the outer crucible 1 permeates the graphite wall of the growth crucible 2 and diffuses in the growth crucible, whereby the pressure of the silicon gas in the growth crucible is maintained or increased.

Since the growth chamber 51 and outer crucible 1 are connected via the conduit 31, the interior pressure of the chamber 51 becomes equal to that of the crucible 1. The atmosphere gas surrounding the growth crucible 2 provided in the outer crucible 1 contains the silicon gas obtained through evaporation of the silicon raw material fed from the outside of the outer crucible. Thus, the silicon gas in the outer crucible 1 permeates the graphite wall of the growth crucible 2 and diffuses in the growth crucible. Therefore, when the thickness of the graphite wall of the growth crucible and the temperature profile in the growth crucible are constant, the pressure of the silicon gas in the growth crucible 2 can be controlled by means of regulation of the pressure in the growth chamber 51. The higher the pressure in the growth chamber 51, the higher the pressure of the silicon gas in the growth crucible. In this case, a sufficient amount of the silicon raw material must be continuously fed into the outer crucible 1 so as to maintain the vapor pressure of silicon in the outer crucible 1 equal to the pressure in the growth chamber.

From the viewpoint of enhancement of the quality of the silicon carbide single crystal, during the course of silicon carbide single crystal growth, preferably, the pressure of the silicon gas in the growth crucible 2 is maintained higher than the equilibrium vapor pressure of the silicon gas contained in the sublimate gas generated from the silicon carbide raw material 11. Therefore, preferably, the pressure in the growth chamber 51 is regulated to a moderately high level. However, when the pressure in the growth crucible for growing the silicon carbide single crystal is increased, the growth rate of the silicon carbide single crystal is lowered due to diffusion of the sublimate gas. Therefore, the pressure of the atmosphere gas surrounding the growth crucible in the growth chamber 51 must be appropriately determined so as to optimize the growth rate and crystallinity of the silicon carbide single crystal.

During the course of silicon carbide single crystal growth, the pressure of the atmosphere gas surrounding the growth crucible in the growth chamber 51 can be regulated to a value within a range between high vacuum and a slightly high, quasi-ambient pressure, i.e., 1.33 to $1.33\times10^5$ Pa. Particularly, in order to efficiently generate the sublimate gas from the silicon carbide raw material, the pressure is preferably regulated to $1.33\times10^2$ to $4.0\times10^4$ Pa. Furthermore, in order to efficiently grow a single crystal of silicon carbide, the pressure during the course of silicon carbide single crystal growth is preferably regulated to $6.65\times10^3$ to $2.0\times10^4$ Pa.

According to the present invention, by regulating the pressure of the atmosphere gas surrounding the growth crucible during the course of silicon carbide single crystal growth to $1.33\times10^2$ to $4.0\times10^4$ Pa, it is possible to produce a silicon carbide single crystal at a growth rate of 1 mm/hour or more and at a micropipe density of 10,000 micropipes/$cm^2$ or less. Furthermore, by regulating the pressure to $6.65\times10^3$ to $2.0\times10^4$ Pa, a silicon carbide single crystal growth rate of 2 mm/hour or more can be attained. The silicon carbide single crystal growth rate of 1 mm/hour or more, preferably of 2 mm/hour or more, enables a silicon carbide single crystal to be efficiently grown.

In the present invention, during the course of silicon carbide single crystal growth, if desired, the silicon carbide single crystal may be doped with impurities. Doping of the silicon carbide single crystal with impurities may be performed by employing a silicon raw material that has been doped with impurities or by feeding doping elements in the form of gas.

Figure 2:
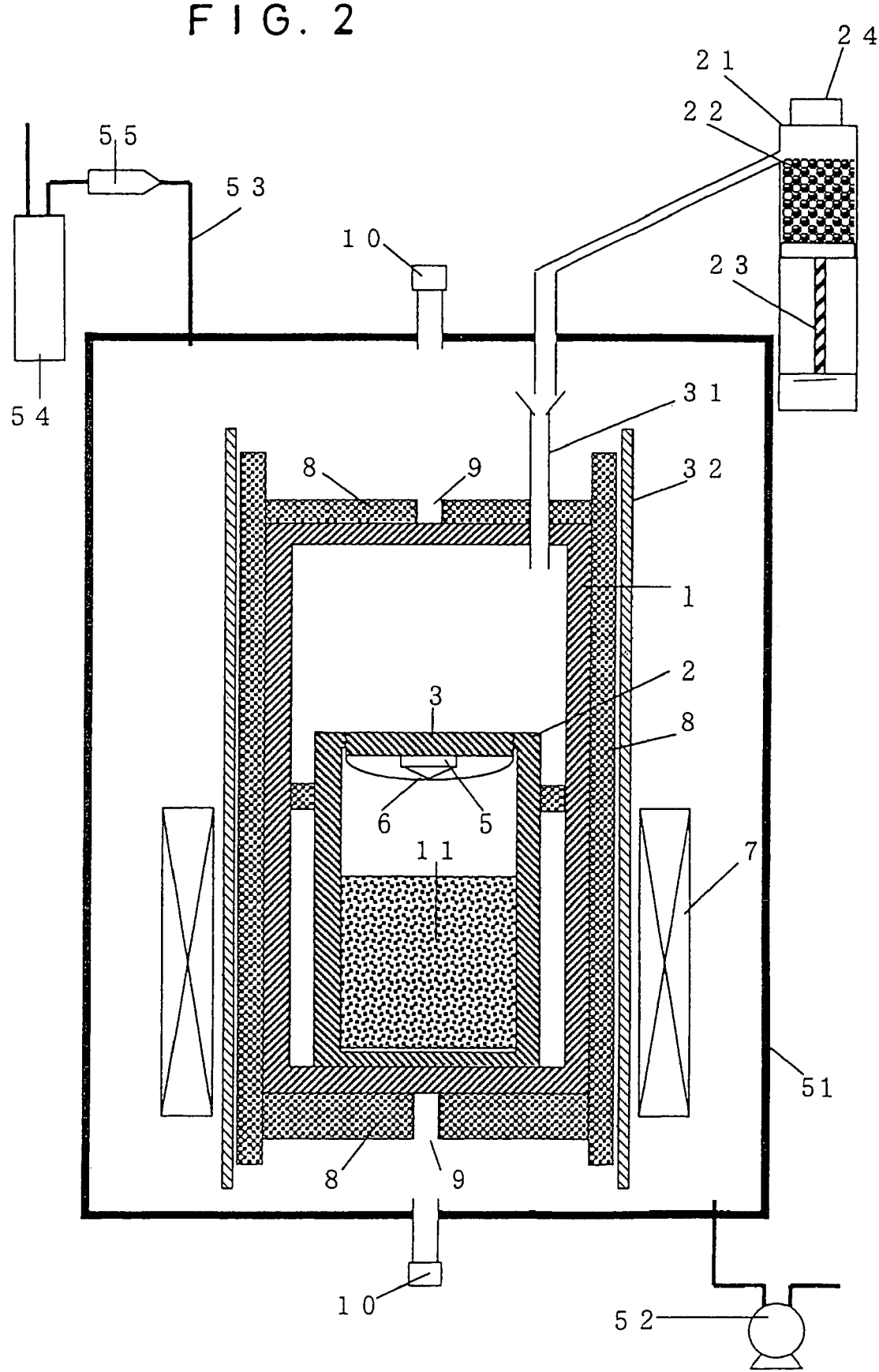
FIG. 2 is a cross section showing another example of the apparatus for producing a silicon carbide single crystal of the present invention.

FIG. 2 shows another example of the apparatus for producing a silicon carbide single crystal of the present invention. FIG. 2 shows a modification of the silicon carbide single crystal production apparatus shown in FIG. 1, in which the lid 3 also serves as the supporter 4 used in the apparatus of FIG. 1, the seed crystal substrate 5 formed of silicon carbide is attached to the lid 3, and the silicon carbide single crystal 6 is gradually grown on the substrate 5. By causing the lid 3 to serve also as the supporter, the apparatus can be made compact.

In the present invention, the mechanism by which generation of crystal defects is suppressed in the silicon carbide single crystal is considered to be as follows. In the sublimate gas generated from the silicon carbide raw material, conceivably, the equilibrium vapor pressure of gas components (e.g., silicon carbide (SiC) and unreacted Si, $Si_2C$ and $SiC_2$) reaches a certain level. Since the graphite-made growth crucible exhibits no hermeticity against gas at a high temperature of about 2,000° C., when the vapor pressure outside of the growth crucible is lower than that inside of the growth crucible, the gas components in the growth crucible readily permeate the graphite wall of the growth crucible. In the typical sublimation process, the pressure of the sublimate gas outside of the growth crucible is almost zero, and therefore, the sublimate gas in the growth crucible tends to leak to the outside of the crucible, whereby the pressure of the sublimate gas becomes lower than the equilibrium vapor pressure thereof.

It has been known that when crystal growth of a compound semiconductor is performed, in order to maintain constant the stoichiometric composition of elements constituting the crystal, maintaining the vapor pressure of the constituent element of high dissociation pressure at a high level during the crystal growth is effective. When the crystal growth is performed, if the vapor pressures of the constituent elements are equal to one another, the amount of the element of high dissociation pressure contained in the grown crystal is lowered, leading to generation of vacancies in the crystal and occurrence of minute lattice strain associated with generation of the vacancies. As a result, there is a high likelihood that such crystal defects induce dislocations and stacking faults in the grown crystal. In the silicon carbide single crystal growth, silicon corresponds to the constituent element of high dissociation pressure.

In the present invention, since the atmosphere gas surrounding the growth crucible contains a silicon gas, unlike the case of the typical sublimation process, silicon of high dissociation pressure diffuses from the outside of the growth crucible through the crucible wall into the crucible, and thus the vapor pressure of the silicon gas in the growth crucible tends to become equal to or higher than the equilibrium vapor pressure of the sublimate gas. Therefore, in the present invention, generation of crystal defects, which is associated with silicon carbide single crystal growth by means of the conventional sublimation process, can be considerably suppressed.

Examples of the present invention will now be described. However, the present invention is not limited to these examples.

EXAMPLE 1

In Example 1, a silicon carbide single crystal was grown by use of the silicon carbide single crystal production apparatus shown in FIG. 1. Firstly, a seed crystal substrate 40 mm in diameter and 1.0 mm in thickness formed from a 6H-SiC single crystal having a (0001) plane was attached, by means of an adhesion technique, to the center portion of the surface, which faces the bottom of a growth crucible, of a supporter (formed of graphite, thickness: 9 mm) provided in the growth crucible. The growth crucible is formed of a bottomed graphite-made hollow cylinder 52 mm in inner diameter and 116 mm in height. A powdery silicon carbide raw material (about 172 g) was placed in the growth crucible at a height of about 52 mm from the bottom of the crucible. The supporter was provided in the growth crucible such that the lower surface of the seed crystal substrate was located at a position 32 mm distant from the level of the raw material. The growth crucible was placed in the center of an outer crucible. The outer crucible is formed of a bottomed graphite-made hollow cylinder 75 mm in inner diameter and 157 mm in height. A graphite-made conduit 5 mm in inner diameter for feeding a silicon raw material is provided in the upper lid of the outer crucible. High-purity spherical polysilicon for semiconductors (purity: 8 nines, average particle size: 1.5 mm) was placed as the silicon raw material in an amount of 100 g within a raw material container. By use of a vibration-type metered feeding apparatus, the silicon raw material was fed from the raw material container through the conduit into the space between the outer crucible and the growth crucible.

The growth crucible and conduit were provided in a growth chamber that can be evacuated. After the growth chamber was evacuated to $1.33\times10^{-1}$ Pa, argon gas was brought into the chamber until the pressure in the chamber reached atmospheric pressure to thereby fill the chamber with an argon atmosphere. Subsequently, the outer crucible was heated to about 2,400° C. over about 30 minutes to thereby perform heat treatment for removing, for example, gas adhering to the crucible. Subsequently, the temperatures of the lower and upper portions of the outer crucible were maintained at about 2,440° C. and 1,900° C., respectively. While argon was brought into the growth chamber, the chamber was evacuated until the pressure of the argon atmosphere reached $2.7 \times 10^4$ Pa. Thereafter, the silicon raw material was continuously fed at a feed rate of 0.12 g/minute into a space between the growth crucible and the outer crucible to perform crystal growth for five hours while evaporating the raw material.

After completion of crystal growth, the growth crucible was opened. A silicon carbide single crystal was grown on the seed crystal substrate attached to the supporter in the growth crucible. The thus grown silicon carbide single crystal was found to have a diameter of about 50 mm at its tip portion and a growth length of 7.0 mm.

Subsequently, the powdery silicon carbide raw material in the growth crucible was exchanged to a fresh silicon carbide raw material, and then a silicon carbide single crystal was grown on the above grown crystal. The second crystal growth was performed for five hours under the same conditions (e.g., temperature and pressure) as those for the first crystal growth.

After completion of the second crystal growth, the growth crucible was opened. A silicon carbide single crystal formed through the second crystal growth was found to have a diameter of about 50 mm at its tip portion and a growth length of 6.0 mm. The thus grown single crystal was cut into pieces along a growth direction, the resultant cross section was subjected to polishing, and the thus polished cross section was observed under a microscope. As a result, the thus grown single crystal was found to have no inclusion. On the basis of the results of Raman spectroscopy of the thus grown single crystal (specifically, on the basis of the position of the peak corresponding to the crystal), it was found that the single crystal was formed of 6H-silicon carbide and contained no other polytype.

The single crystal was cut into pieces along a direction perpendicular to the growth direction, and the resultant cross section was observed under a microscope. As a result, the density of micropipes (i.e., defects specific to silicon carbide crystal growth) was found to be about $10^5$ micropipes/cm$^2$ in the seed crystal and to be about $10^3$ micropipes/cm$^2$ in the grown single crystal at a position 5 mm distant from the seed crystal. That is, the micropipe density was reduced by a factor of about 1/100. The observation results revealed that the micropipe density decreases in accordance with growth of the single crystal.

COMPARATIVE EXAMPLE 1

In Comparative Example 1, a silicon carbide single crystal was grown by use of the apparatus shown in FIG. 1. In Comparative Example 1, the same crucibles and seed crystal substrate as those employed in Example 1 were employed, and crystal growth was performed under the same conditions (e.g., temperature and pressure) as those for Example 1. However, after the temperature of the growth crucible was maintained at the growth temperature, and then the growth chamber was evacuated until the pressure of the argon atmosphere reached $2.7 \times 10^4$ Pa, the silicon raw material was not fed from the outside of the outer crucible into the crucible. Crystal growth was performed for five hours as in the case of Example 1.

After completion of crystal growth, the growth crucible was opened. Polycrystalline silicon carbide was grown over the entire surface of the seed crystal substrate attached to the supporter in the growth crucible. The thus grown polycrystalline silicon carbide was found to have a diameter of about 50 mm at its tip portion and a growth length of 6.5 mm. The thus grown crystal was cut into pieces along a growth direction, the resultant cross section was subjected to polishing, and the thus polished cross section was observed under a microscope. As a result, it was found that polycrystallization was initiated from a position atop the seed crystal substrate.

EXAMPLE 2

In Example 2, a silicon carbide single crystal was grown using the apparatus shown in FIG. 1, the same crucibles and seed crystal substrate as in Example 1 were employed, and the same growth process as in Example 1 was adopted. However, the temperatures of the lower and upper portions of the outer crucible were maintained at about 2,480° C. and 1,980° C., respectively, and the argon atmosphere in the growth chamber was maintained under a pressure of $1.5 \times 10^4$ Pa during the course of crystal growth. The crystal growth was performed for 5 hours while introducing the silicon raw material into the outer crucible in the same manner as in Example 1.

The thus grown silicon carbide single crystal was found to have a diameter of about 50 mm at its tip portion and a growth length of 10.5 mm.

Subsequently, the powdery silicon carbide raw material in the growth crucible was exchanged to a fresh one, and a silicon carbide single crystal was then grown on the above grown crystal. The second crystal growth was performed for five hours under the same conditions (e.g., temperature and pressure) as in the first crystal growth.

After completion of the second crystal growth, the growth crucible was opened. A silicon carbide single crystal formed through the second crystal growth was found to have a diameter of about 50 mm at its tip portion and a growth length of 10.2 mm. The thus grown single crystal was cut into pieces along a growth direction, the resultant cross section was subjected to polishing, and the thus polished cross section was observed under a microscope. As a result, the thus grown single crystal was found to have no inclusion. On the basis of the results of Raman spectroscopy of the thus grown single crystal (specifically, on the basis of the position of the peak corresponding to the crystal), it was found that the single crystal grown was formed of 6H-silicon carbide and contained no other polytype.

The single crystal was cut into pieces along a direction perpendicular to the growth direction, and the resultant cross section was observed under a microscope. As a result, the density of micropipes was found to be about 15 micropipes/cm$^2$ in the grown single crystal at a position 15 mm distant from the seed crystal.

INDUSTRIAL APPLICABILITY

According to the production method and production apparatus for a silicon carbide single crystal of the present invention, crystal defects in the resultant silicon carbide single crystal can be reduced. For example, the density of micropipes in a silicon carbide single crystal grown by means of the method of the present invention can be reduced to 10,000 micropipes/cm$^2$ or less. In addition, according to the present invention, the crystal growth rate, which is limited in the conventional sublimation process, can be increased to about 1.0 mm/hour or more while the quality of the single crystal is maintained at a high level and can be increased through optimization of the conditions to 2.0 mm/hour or more, whereby production efficiency can be enhanced.

The invention claimed is:

1. A method for producing a silicon carbide single crystal, comprising the steps of:
    providing a graphite-made growth crucible with a low-temperature section and a high-temperature section;
    placing a seed crystal substrate formed of silicon carbide single crystal in the low-temperature section of the growth crucible;
    placing a silicon carbide raw material in the high-temperature section of the growth crucible; and
    depositing a gas sublimated from the silicon carbide raw material onto the seed crystal substrate to thereby grow a silicon carbide single crystal,
    further comprising the steps of:
    using an outer crucible to surround the growth crucible, with a space left therebetween;
    continuously feeding a silicon raw material in solid form from outside into the space; and
    evaporating the silicon raw material in the space to thereby form a silicon gas serving as the atmosphere gas surrounding the growth crucible
    wherein the silicon carbide single crystal is grown with an atmosphere gas that surrounds the growth crucible containing a silicon gas and with vapor pressure of the silicon gas that surrounds the growth crucible continuously maintained to be higher than that of the silicon gas in the gas sublimated from the silicon carbide raw material in the growth crucible and with vapor pressure of silicon gas in the growth crucible maintained substantially equal to or higher than equilibrium vapor pressure of the silicon gas contained in the sublimated gas.

2. The method for producing a silicon carbide single crystal according to claim 1, wherein the silicon raw material in solid form is in a form of powder constituted by particles having a diameter of 0.2 to 5 mm.

3. The method for producing a silicon carbide single crystal according claim 1, wherein the silicon raw material is fed at a rate of 0.5 to 20 mg/second.

4. The method for producing a silicon carbide single crystal according to claim 1, wherein a position within the space to which the silicon raw material is fed has a temperature regulated to at least 1,900° C.

5. The method for producing a silicon carbide single crystal according to claim 1, wherein the atmosphere gas surrounding the growth crucible has a pressure regulated to $1.33 \times 10^2$ to $4.0 \times 10^4$ Pa.

6. The method for producing a silicon carbide single crystal according to claim 5, wherein the atmosphere gas surrounding the growth crucible has a pressure regulated to $6.65 \times 10^3$ to $2.0 \times 10^4$ Pa.

7. The method for producing a silicon carbide single crystal according to claim 5, wherein a growth rate of the silicon carbide single crystal is 1 mm/hour or more.

* * * * *